(12) United States Patent  
Tanaka

(10) Patent No.: US 9,001,415 B2
(45) Date of Patent: Apr. 7, 2015

(54) REFLECTIVE SEMICONDUCTOR OPTICAL AMPLIFIER WITH CONSTANT GAIN VERSUS WAVELENGTH

(75) Inventor: Shinsuke Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 837 days.

(21) Appl. No.: 12/824,653

(22) Filed: Jun. 28, 2010

(65) Prior Publication Data

US 2011/0013270 A1  Jan. 20, 2011

(30) Foreign Application Priority Data

Jul. 14, 2009  (JP) ................................ 2009-165751

(51) Int. Cl.
*H01S 5/00* (2006.01)
*H01S 5/50* (2006.01)
*H01S 5/10* (2006.01)
*H01S 5/20* (2006.01)

(52) U.S. Cl.
CPC ............... *H01S 5/5018* (2013.01); *H01S 5/101* (2013.01); *H01S 5/1085* (2013.01); *H01S 5/2018* (2013.01); *H01S 5/5045* (2013.01)

(58) Field of Classification Search
USPC ........................................................ 359/344
See application file for complete search history.

(56) References Cited

U.S. PATENT DOCUMENTS

| 5,239,410 | A * | 8/1993 | Nishimura et al. ........... 359/344 |
| 5,894,492 | A * | 4/1999 | Welch et al. .................. 372/50.1 |
| 7,046,435 | B2 | 5/2006 | Shin et al. |
| 7,542,201 | B2 * | 6/2009 | Tanaka et al. ................. 359/344 |
| 2002/0067540 | A1 * | 6/2002 | Delprat et al. ................. 359/344 |
| 2002/0105992 | A1 * | 8/2002 | Arakawa et al. ................ 372/50 |
| 2003/0035459 | A1 * | 2/2003 | Wilson et al. ................... 372/97 |
| 2003/0068125 | A1 * | 4/2003 | Yoshida et al. ................. 385/27 |
| 2005/0135738 | A1 * | 6/2005 | Shin et al. ...................... 385/27 |
| 2005/0141077 | A1 * | 6/2005 | Kim et al. ...................... 359/333 |
| 2010/0158524 | A1 * | 6/2010 | Kwon et al. .................... 398/70 |
| 2010/0245990 | A1 * | 9/2010 | Tanaka et al. ................. 359/344 |
| 2011/0044359 | A1 * | 2/2011 | Butler et al. .................... 372/20 |

FOREIGN PATENT DOCUMENTS

JP  2005-236300 A  9/2005

* cited by examiner

*Primary Examiner* — Eric Bolda
(74) *Attorney, Agent, or Firm* — Westerman, Hattori, Daniels & Adrian, LLP

(57) ABSTRACT

A semiconductor optical amplifier includes a semiconductor substrate; an active layer that includes a first region and a second region formed over the semiconductor substrate; and a reflection part that is formed along the second region and includes a first portion that reflects a first wavelength light and a second portion that reflects a second wavelength light with an optical gain lower than an optical gain of the first wavelength light; wherein, the first portion is formed closer to the first region side than the second portion.

20 Claims, 18 Drawing Sheets

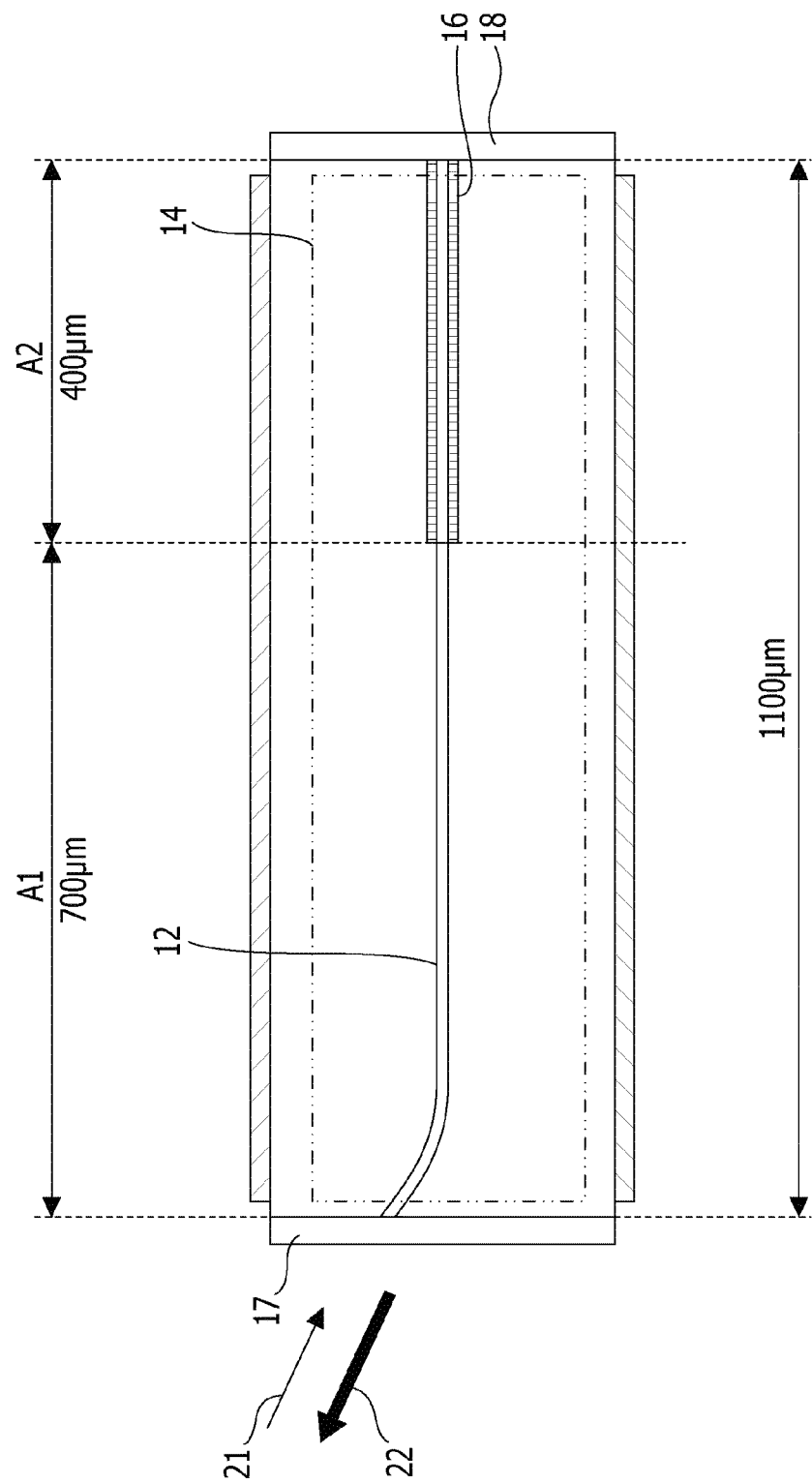

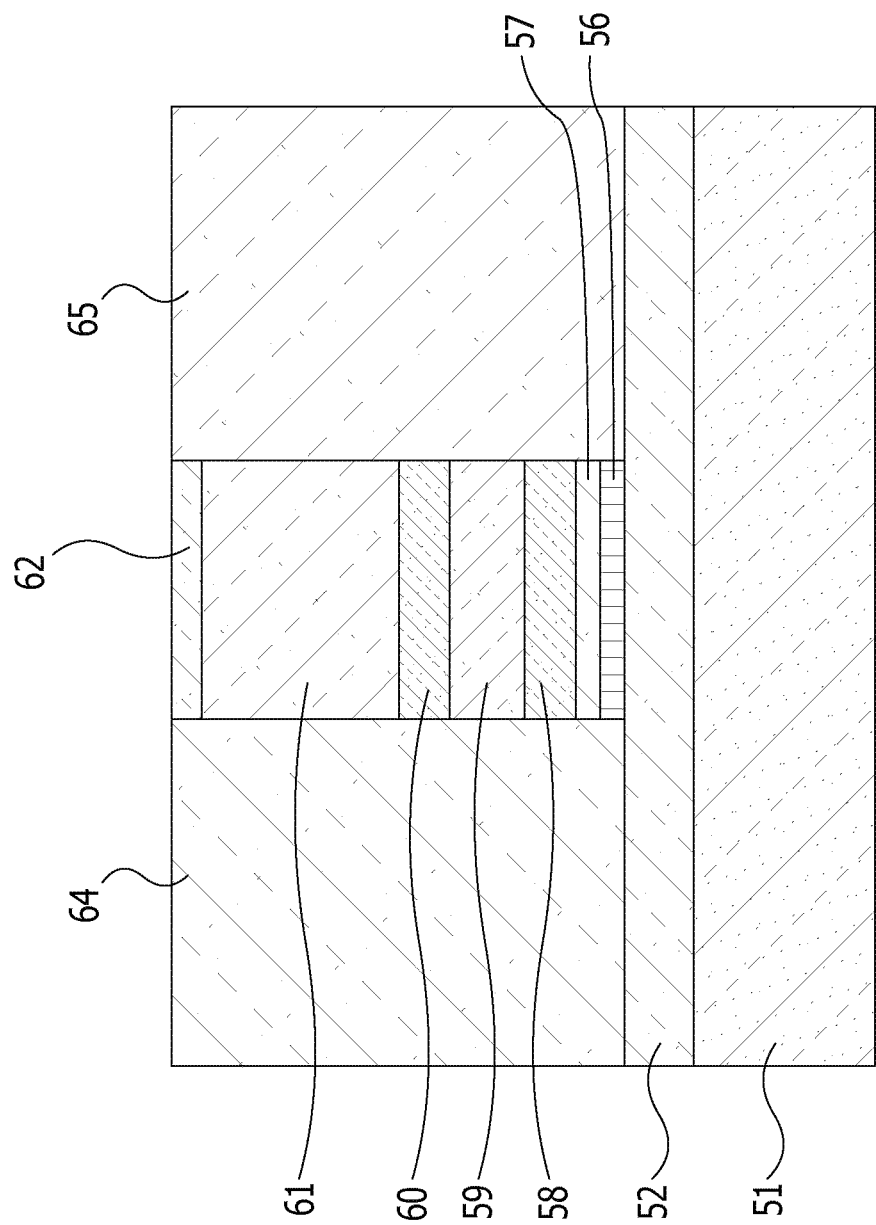

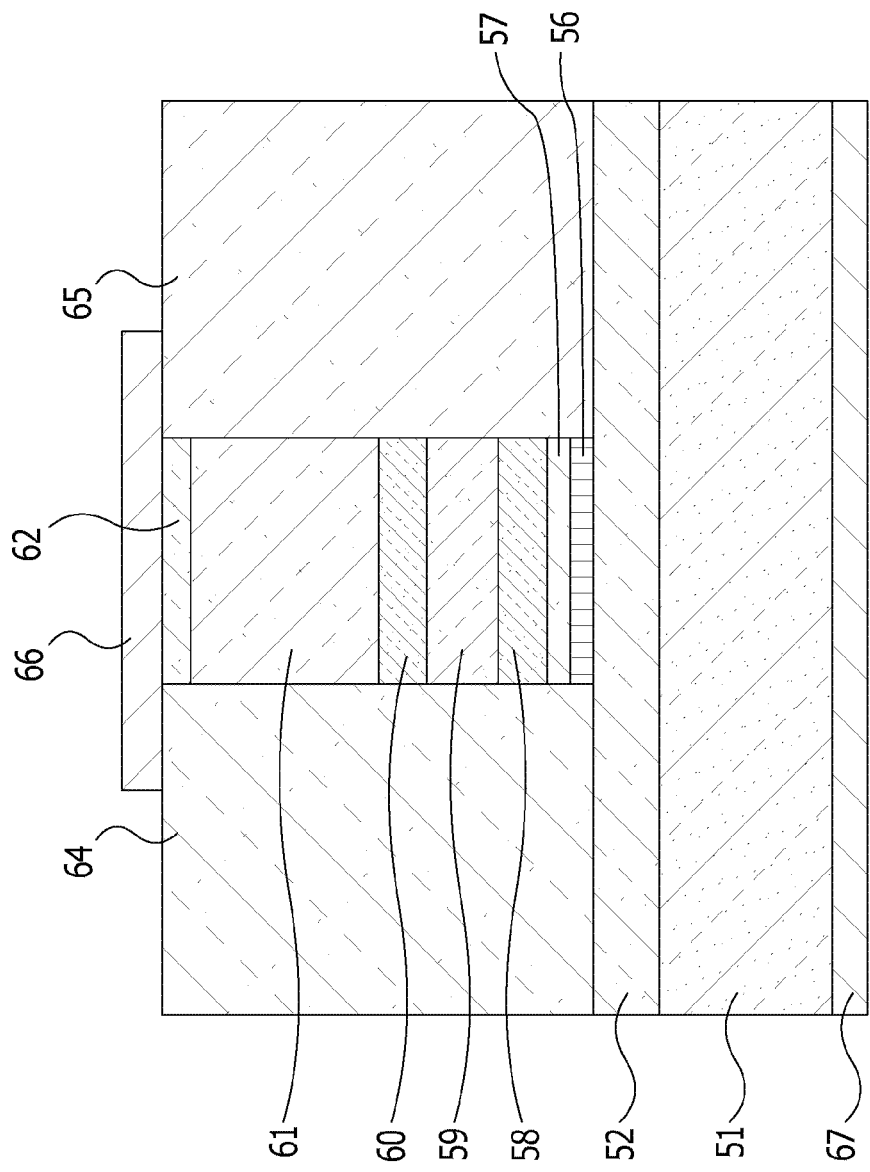

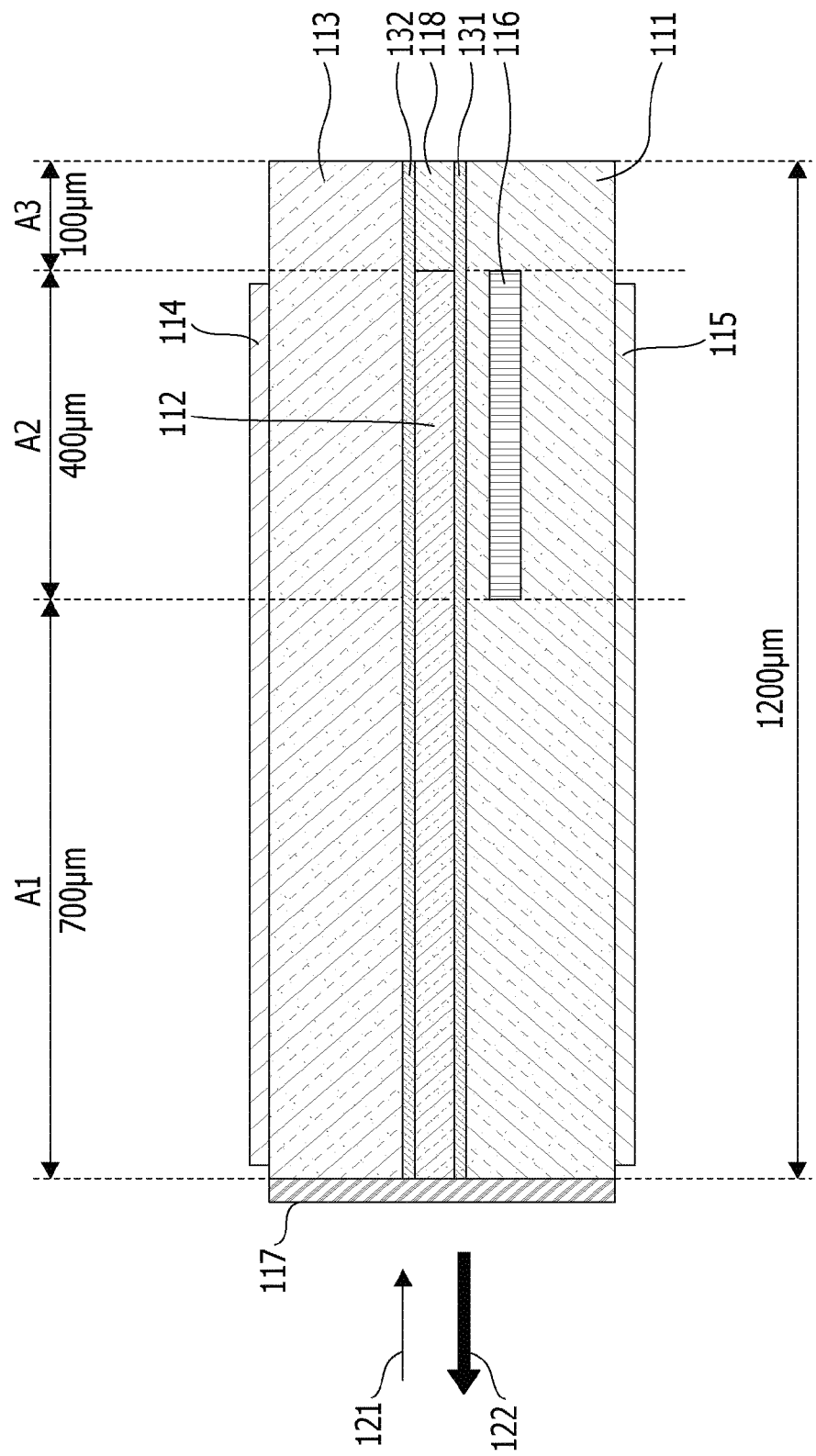

REFLECTIVE SEMICONDUCTOR OPTICAL AMPLIFIER WITH CONSTANT GAIN VERSUS WAVELENGTH

CROSS-REFERENCE TO RELATED APPLICATIONS

This application is based upon and claims the benefit of priority of the prior Japanese Patent Application No. 2009-165751, filed on Jul. 14, 2009, the entire contents of which are incorporated herein by reference.

FIELD

The present disclosure relates to a semiconductor optical amplifier.

BACKGROUND

In an access network for transferring data between a base station of a carrier and a user site, photonic networks with large capacity and high speed have been increasing. Wavelength Division Multiplex-Passive Optical Networking (WDM-PON), a next generation optical access network system that assigns an individual wavelength to each user using a Wavelength Division Multiplex (WDM) system, has been reviewed for replacement of a conventional Time Division Multiplex (TDM) system. In the WDM-PON system, the following network configuration is proposed. The configuration is that a wide band light source of continuous wave (CW) is provided for a base station device and a Reflective Semiconductor Optical Amplifier (RSOA) is provided for a user site device, and the user site amplifies and modulates a CW signal light transmitted from the base station and returns the CW signal light.

As an example, FIG. 1 illustrates such an optical access system. In the optical access system, an optical line terminal (OLT) 310 that is a base station device and an optical network unit (ONU) 320 that is a user site device are coupled through an Arrayed Waveguide Grating (AWG) 331 by a single mode optical fiber 330. The AWG 331 distributes signal lights of a plurality of wavelengths (wavelength 1, wavelength 2, wavelength 3, ... wavelength N) for each wavelength to the ONU 320 of each user site. In the OLT 310, an upstream signal CW light source 311 and an upstream signal receiver 312 are coupled to an optical circulator 313 and such a set of the coupled elements is coupled to an AWG 314 for each of the wavelengths. Signal lights emitted from the upstream signal CW light source 311 in the OLT 310 are transmitted from the OLT 310 through the optical circulator 313 and the AWG 314. The signal lights are input to the AWG 331 through the optical fiber 330 and are input to the ONU 320 after the AWG 331 divides the signal lights for each of the wavelengths of the respective user site.

The ONU 320 includes a reflective semiconductor optical amplifier 321 and the reflective semiconductor optical amplifier 321 amplifies and returns the input signal light. By controlling a drive current or a voltage in the reflective semiconductor optical amplifier 321, the returned signal lights are modulated by data pattern. The returned upstream signal lights are transmitted to the OLT 310 again through the AWG 331 and the optical fiber 330. In the OLT 310, the returned upstream signal lights that are input to the signal receiver 312 through the AWG 314 and the optical circulator 313 are demodulated.

In the above-described optical access system, respective user sites are provided with the ONU 320. In the respective ONUs 320, the reflective semiconductor optical amplifier 321 is provided.

It is preferable that the reflective semiconductor optical amplifier 321 may be manufactured with a low cost and may be operated at uniform input light intensities for various wavelengths.

SUMMARY

According to an aspect of the invention, a semiconductor optical amplifier includes a semiconductor substrate; an active layer that includes a first region and a second region formed over the semiconductor substrate; and a reflection part that is formed along the second region and includes a first portion that reflects a first wavelength light and a second portion that reflects a second wavelength light with an optical gain lower than an optical gain of the first wavelength light; wherein, the first portion is formed closer to the first region side than the second portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a top perspective view of the reflective semiconductor optical amplifier according to the first embodiment;

FIGS. 8A to 8E illustrate a manufacturing process chart of the reflective semiconductor optical amplifier according to the first embodiment;

FIG. 11 is a structural diagram of the reflective semiconductor optical amplifier according to a second embodiment;

DESCRIPTION OF EMBODIMENTS

[First Embodiment]

Figure 1:
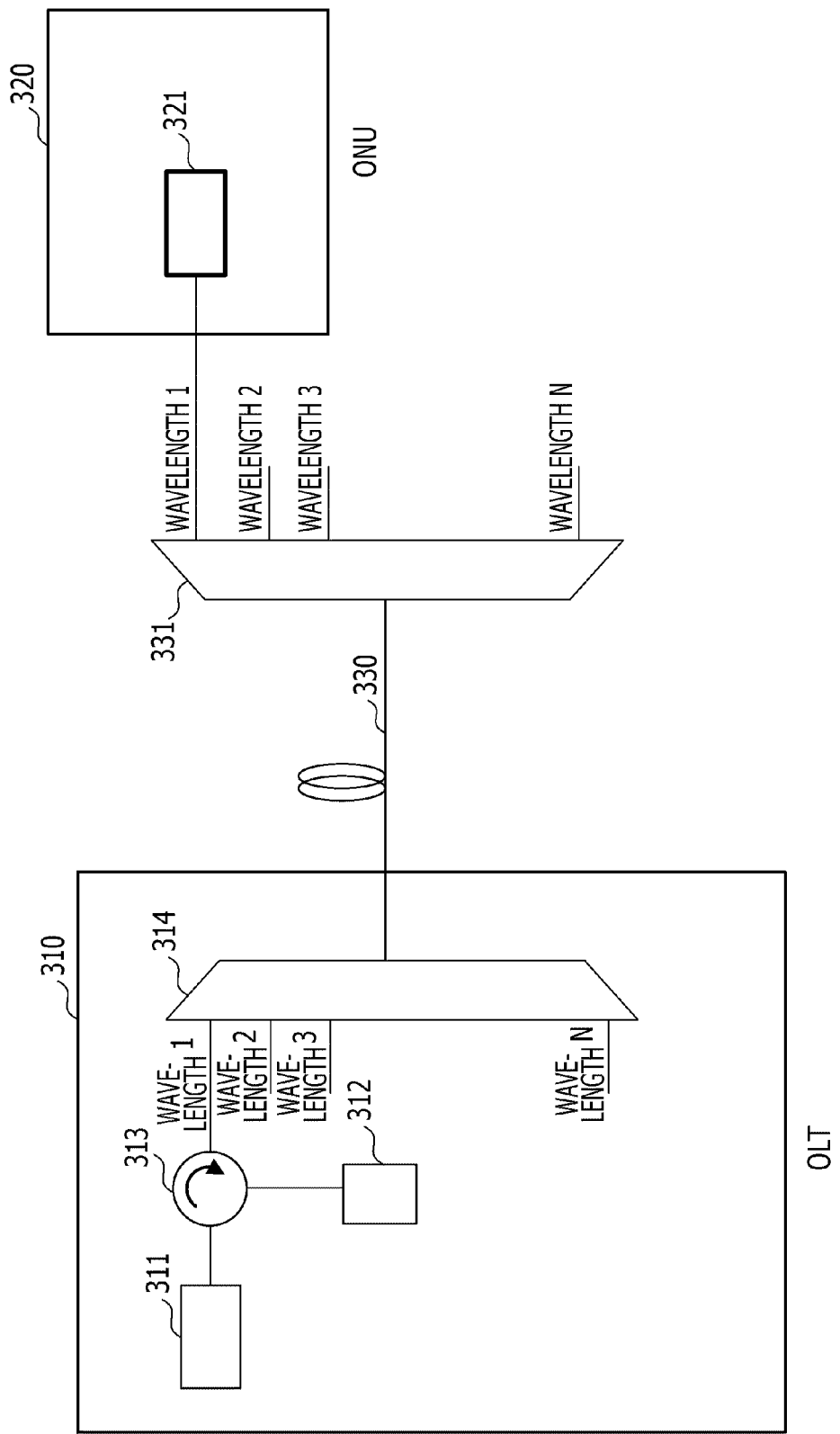
FIG. 1 illustrates a schematic configuration of the WDM-PON access system using reflective semiconductor optical amplifier.
Figure 2:
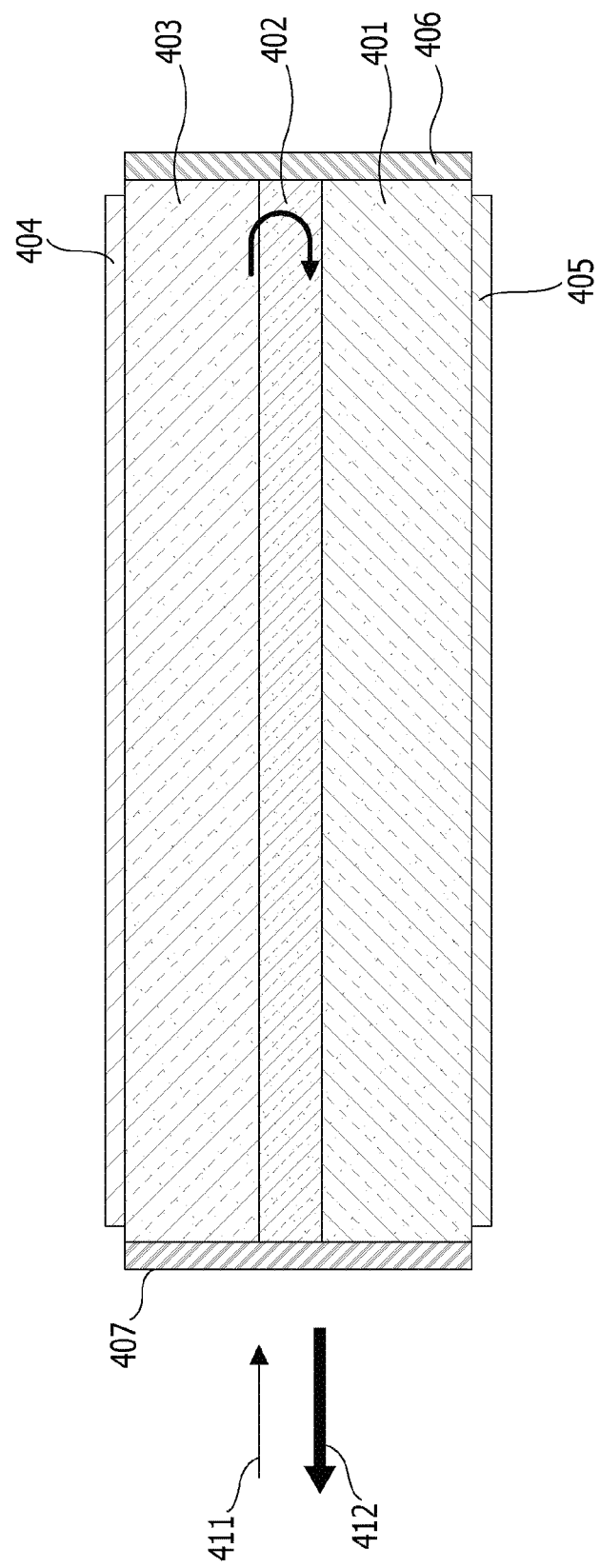
FIG. 2 illustrates a configuration of a reflective semiconductor optical amplifier.

The reflective semiconductor optical amplifier illustrated in FIG. 2 is obtained by laminating a semiconductor optical amplifier (SOA) active layer 402, a clad layer 403, and an anode electrode 404 over a semiconductor substrate 401 such as InP. A cathode electrode 405 is formed over a back surface of the semiconductor substrate 401. A high reflection film 406 is formed over one end face of the laminated layers, and an antireflection film 407 is formed over the other end face.

In the reflective semiconductor optical amplifier, an input signal light 411 that is a CW light is made incident on the end face where the antireflection film 407 is formed, is reflected by the high reflection film 406, and is emitted from the end face where the antireflection film 407 is formed as a reflected signal light 412. By applying a certain voltage between the anode electrode 404 and the cathode electrode 405, the signal light is amplified and modulated while propagating in the SOA active layer 402 and thereby the modulated output signal light 412 is emitted from the end face where the antireflection film 407 is formed.

Figure 3:
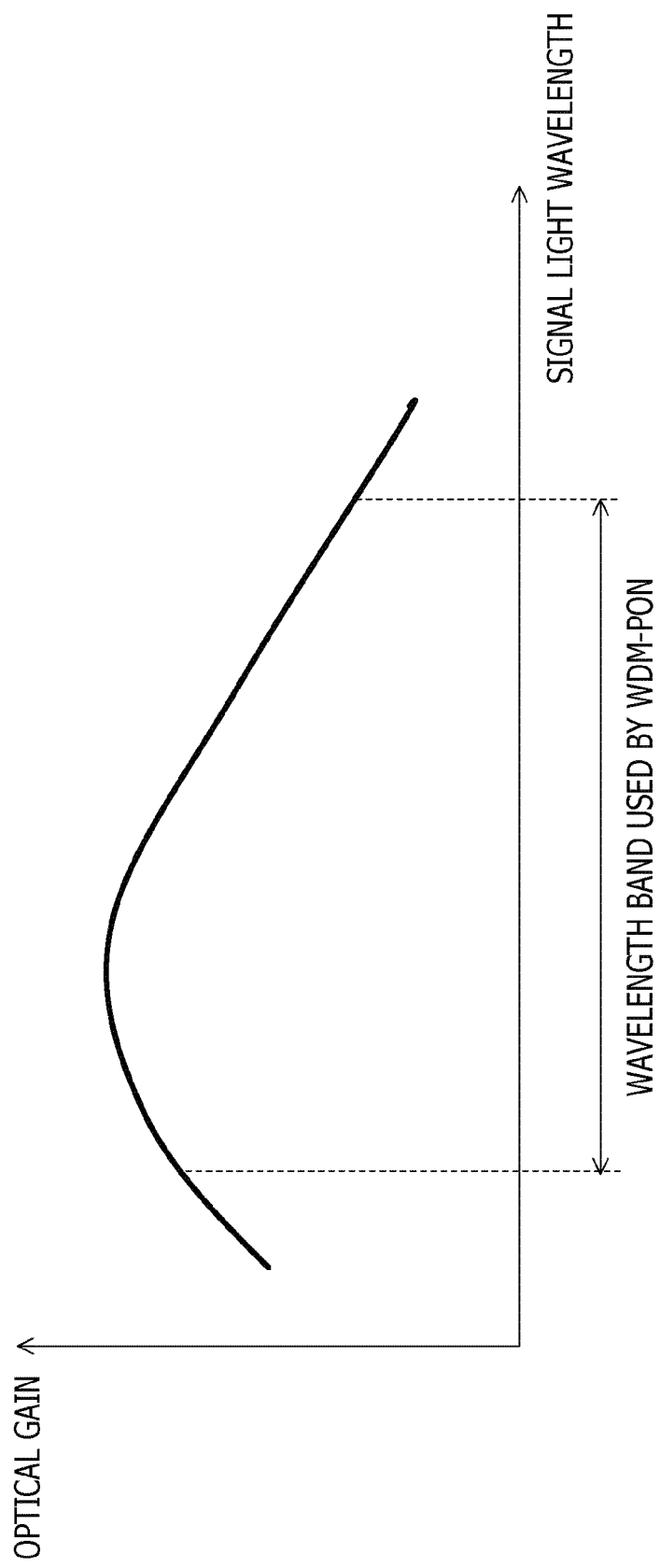
FIG. 3 illustrates an optical gain spectrum of the reflective semiconductor optical amplifier illustrated in FIG. 2.

FIG. 3 illustrates an optical gain spectrum of the reflective semiconductor optical amplifier illustrated in FIG. 2. In the reflective semiconductor optical amplifier illustrated in FIG. 2, optical gain may be different depending on signal wavelengths due to a large wavelength dependence of an internal gain coefficient at the SOA active layer. Accordingly, in a wavelength band used in the WDM-PON, optical gain may be different depending on the wavelengths of lights, and it results in the different intensity of the output signal light 412 corresponding to the signal wavelength, etc.

[Reflective Semiconductor Optical Amplifier]

Figure 4:
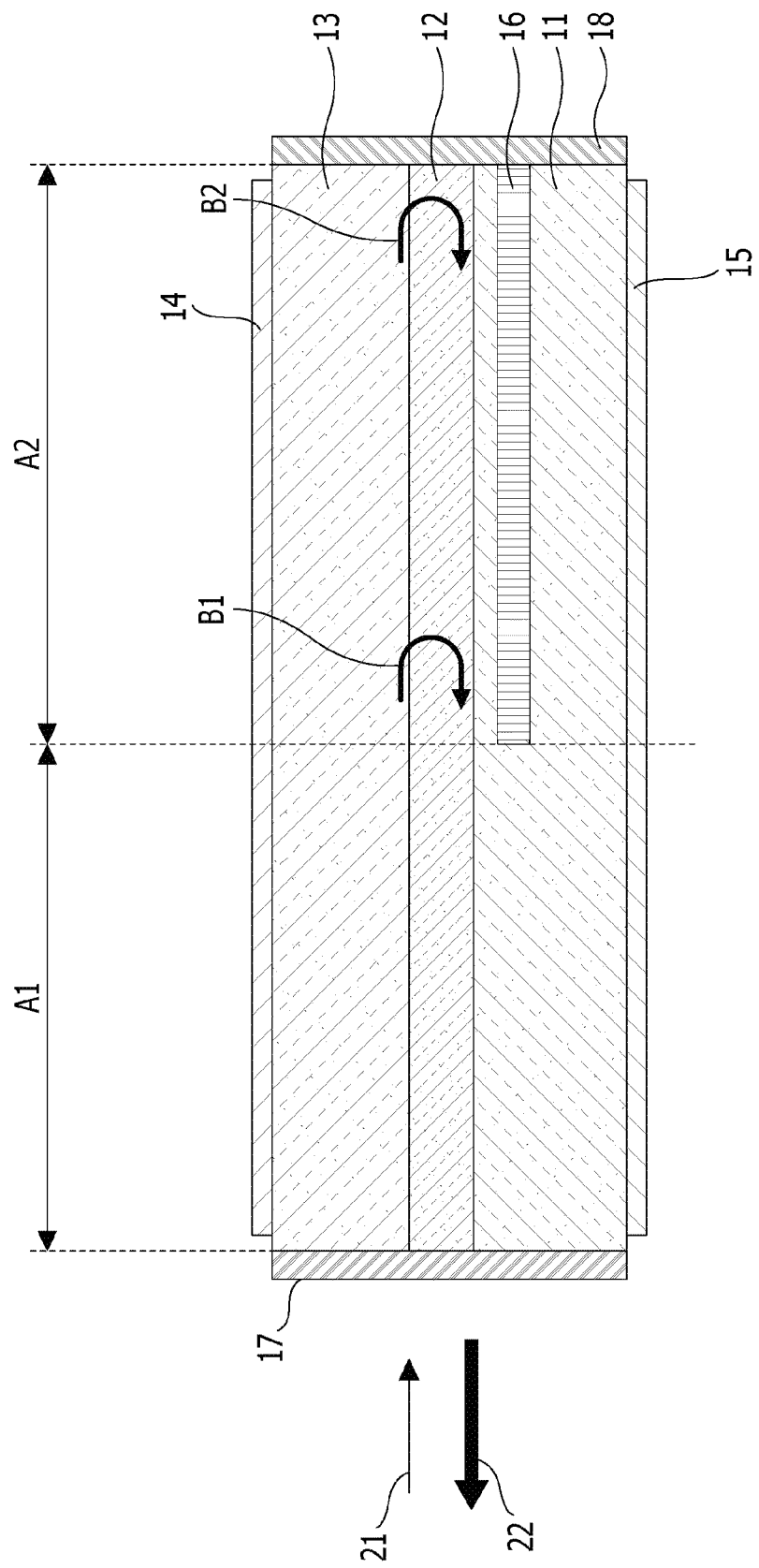
FIG. 4 is a structural diagram of the reflective semiconductor optical amplifier according to a first embodiment.

In FIG. 4, the reflective semiconductor optical amplifier according to the embodiment. A semiconductor optical amplifier (SOA) active layer 12 and a clad layer 13 that form an optical waveguide, are grown over a semiconductor substrate 11 such as InP. An anode electrode 14 is formed over the clad layer 13 and a cathode electrode 15 is formed over a back surface of the semiconductor substrate 11.

The reflective semiconductor optical amplifier according to the embodiment includes a first region A1 and a second region A2. A chirped grating 16 is formed over the second region A2. The chirped grating 16 reflects an input signal light 21 that is incident from the end face of the first region A1.

A first antireflection film 17 is formed over the end face of the incident side and a second antireflection film 18 is formed over the end face where the chirped grating 16 is formed. The first antireflection film 17 and the second antireflection film 18 transmit light with a wavelength of a signal light and formed with a multi-layered dielectric film obtained by alternately laminating two materials with different refractive index.

The reflective semiconductor optical amplifier according to the embodiment modulates a signal light that is incident from the end face where the first antireflection film 17 is formed by applying a voltage between the anode electrode 14 and the cathode electrode 15.

The input signal light 21 that is incident from the end face where the first antireflection film 17 is formed is reflected by the chirped grating 16 and emitted from the end face where the first antireflection film 17 is formed again as an output signal light 22. A unwanted light that is not reflected by the chirped grating 16, in other words, light with wavelength other than the reflection bandwidth of the chirped grating 16 may cause a excess noise by reflecting and mixing to the output signal light 22. Accordingly, in order to reduce, if not prevent, the above-described reflection of a unwanted light with the wavelength out of reflection bandwidth of the chirped grating 16, the second antireflection film 18 which has a sufficiently wide operation bandwidth, is formed over the end face where the chirped grating 16 is formed. An optical confinement layer, which is not illustrated, may be formed over both sides of the SOA active layer 12.

The chirped grating 16 is a diffraction grating in which a central wavelength of reflection (Bragg wavelength) in the diffraction grating is modulated along a direction of light propagation by spatially modulating the diffraction grating period and, or the refractive index. The chirped grating 16 may be formed at any place as long as it has an overlap to an optical mode field distribution of a signal light that propagates in the SOA active layer 12. For example, the chirped grating 16 may be formed between the semiconductor substrate 11 and the SOA active layer 12, between the SOA active layer 12 and the anode electrode 14, a surface of the clad layer 13, or a side surface of the SOA active layer 12. A coupling coefficient that is an indicator of the intensity of a diffraction effect on a signal light by the chirped grating 16 is determined according to a position where the chirped grating 16 is formed. Thus, it is preferable that the chirped grating 16 is provided where desired reflection diffraction effect may be achieved.

The chirped grating 16 enables the reflective SOA to vary a position where the signal light reflects according to its wavelength. Accordingly, a effective length that a signal light propagates along the SOA active layer 12 may be varied according to a wavelength of incident signal light.

Optical gain G in the semiconductor optical amplifier may be obtained by the following expression (1) where an optical confinement coefficient to the SOA active layer 12 of the optical waveguide mode is Γ, an internal gain coefficient in the SOA active layer 12 is g, an internal loss coefficient in the SOA active layer 12 is α, and an effective length of the semiconductor optical amplifier is L;

$$G=\exp\{(\Gamma \times g-\alpha)\times L\} \quad (1)$$

As indicated by the expression (1), increasing the effective length of the semiconductor optical amplifier L exponentially increases the optical gain G.

In the case of the reflective semiconductor optical amplifier illustrated in FIG. 2, light is reflected by a high reflection film 406 regardless of its wavelength. Hence, the value of the effective length of the semiconductor optical amplifier becomes substantially constant without depending on a wavelength.

The reflective semiconductor optical amplifier according to the embodiment may determine a position of signal light reflection light with respect to each wavelength by forming the chirped grating 16 illustrated in FIG. 4. Thus, in the semiconductor optical amplifier according to the above embodiment, the effective length for a signal light of a wavelength with a low internal gain coefficient may be formed long, while the effective length for a signal light of a wavelength with a high internal gain coefficient may be formed short. Accordingly, the reflective semiconductor optical amplifier that may achieve substantially uniform optical gain without depending on signal wavelength may be obtained.

For example, in the chirped grating 16 provided in the second region A2, a diffraction grating for reflecting signal light of a wavelength with a high internal gain coefficient is formed over a first portion B1 of a side where the first antireflection film 17 is formed. As a result, a distance from an end face of an incident side, where the incident light signal is made incident, to the first portion B1, where the signal light is reflected, becomes short, and thereby the effective length may be reduced. On the other hand, in the chirped grating 16, a diffraction grating for reflecting signal light of a wavelength with a low internal gain coefficient is formed over a second portion B2 in a vicinity of a side where the second antireflection film 18 is formed. As a result, a distance from the end face of the incident side to the second portion B2 where the signal light is reflected increases, and thereby the effective length may be increased. Accordingly, substantially uniform optical gain without depending on a wavelength may be obtained by canceling out the wavelength dependence of an internal gain coefficient with a inverse wavelength dependence of the effective length.

The above explanation is based on, for example, lights with two kinds of wavelengths; one is a light with a wavelength of a high internal gain coefficient and the other is light with a wavelength of a low internal gain coefficient. However, in the reflective semiconductor optical amplifier according to the embodiment, the chirped grating 16 may reflect signal light of any wavelength with high to low internal gain coefficients by consecutively changing reflection positions. In other words, portions where each of the wavelengths is reflected in the chirped grating 16 are consecutively formed in response to consecutive changes in wavelengths of signal lights. Accordingly, portions in the chirped grating 16 where each of the wavelength lights are reflected may be formed so that a portion where a signal light of a wavelength with a relatively high internal gain is reflected may come closer to the incident side of a signal light.

Figure 5:
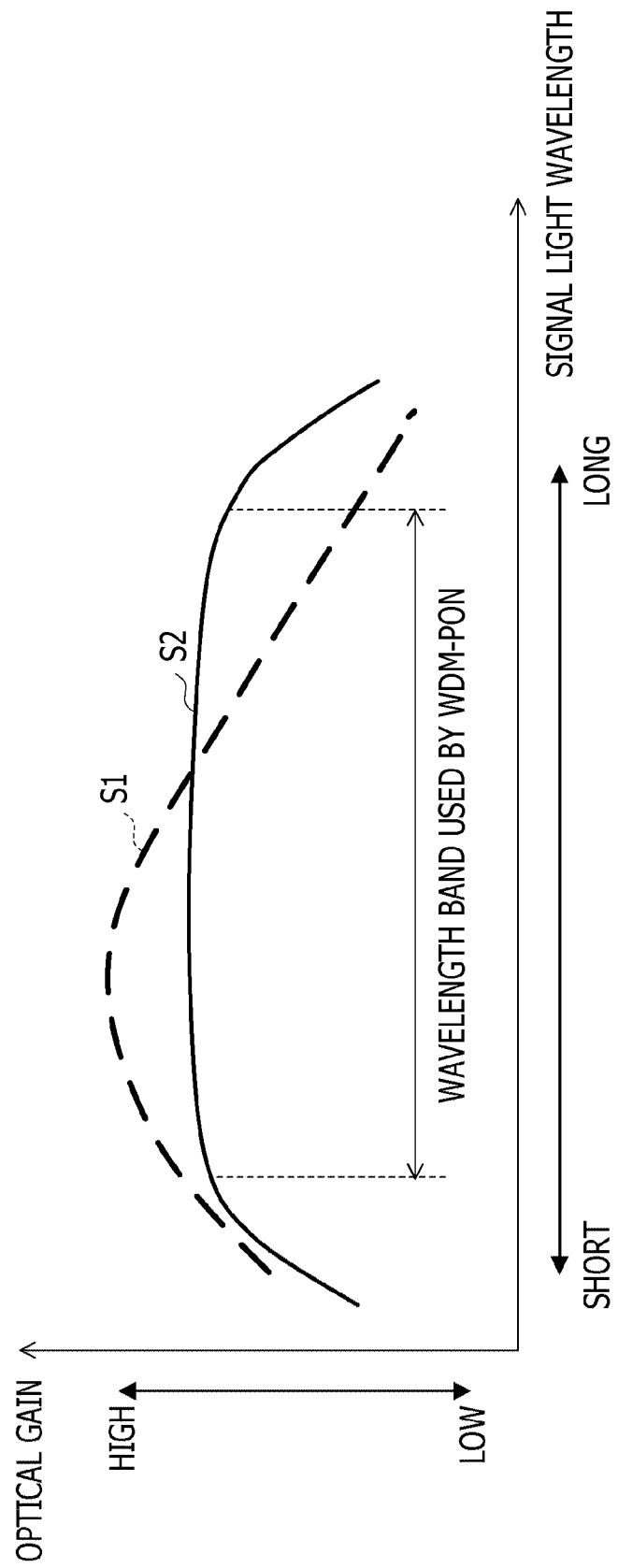
FIG. 5 is a signal light wavelength dependence of the optical gain in the reflective semiconductor optical amplifier according to the first embodiment.

As illustrated in FIG. 5, for a wavelength band used in the WDM-PON, a gain spectrum S1 in the SOA active layer 12 when a chirped grating is not provided exhibits a large wavelength dependence. Thus, optical gain substantially differs depending on respective wavelengths in the wavelength band used in the WDM-PON. However, in the reflective semiconductor optical amplifier according to the embodiment, substantially constant optical gain illustrated in the optical gain spectrum S2 may be achieved over the wavelength band used in the WDM-PON by providing the chirped grating 16.

Figure 6:
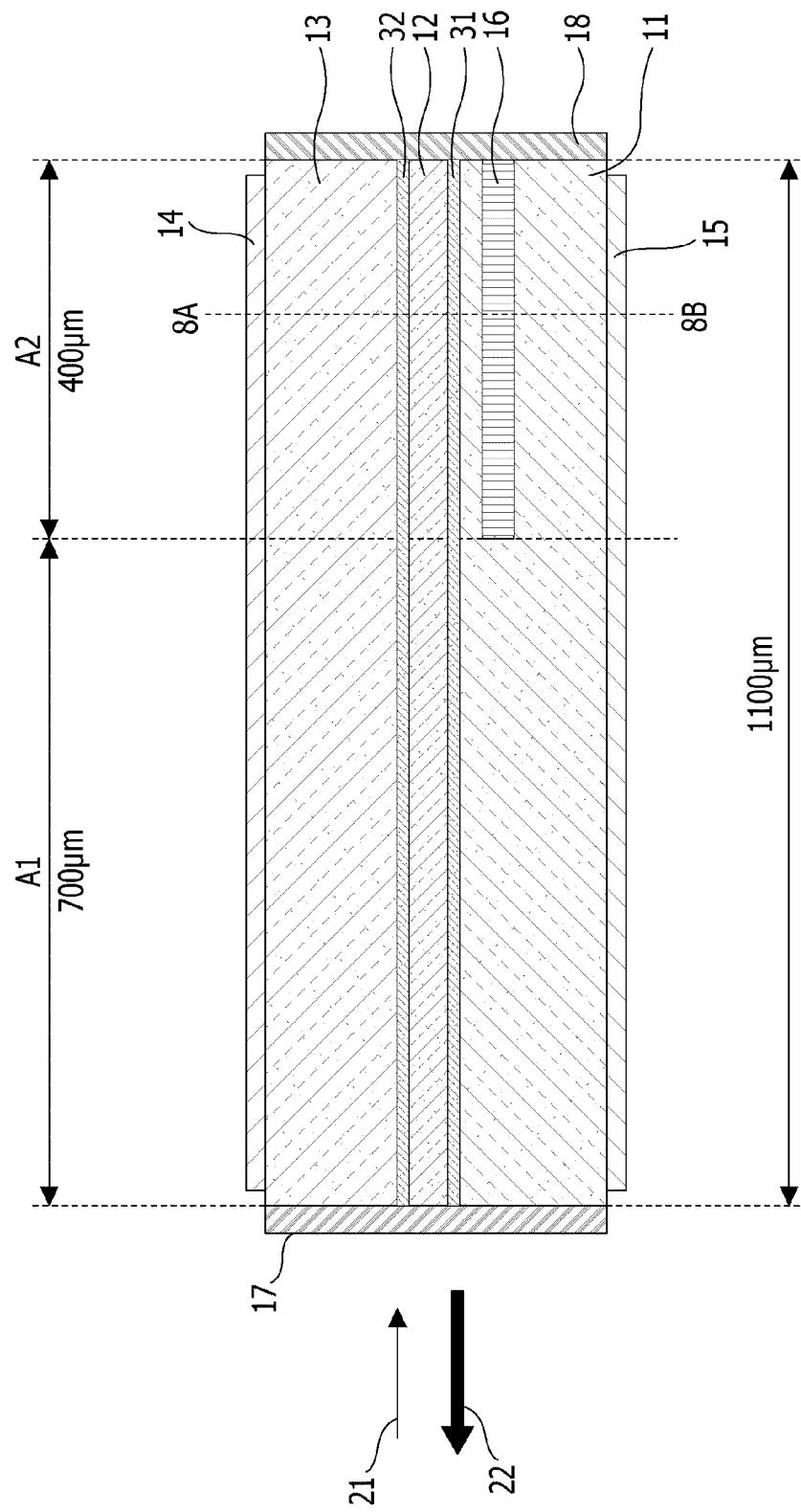
FIG. 6 is a structural diagram of the reflective semiconductor optical amplifier according to the first embodiment.

The reflective semiconductor optical amplifier according to the embodiment will be described in detail by referring to FIGS. 6 and 7. FIG. 6 is a structural diagram of a section along a lamination direction of the reflective semiconductor optical amplifier according to the embodiment. FIG. 7 is a top perspective view of the reflective semiconductor optical amplifier according to the embodiment.

In the reflective semiconductor optical amplifier according to the embodiment, a first optical confinement layer 31, an SOA active layer 12, a second optical confinement layer 32, and a p-InP clad layer 13 are laminated over an n-InP semiconductor substrate 11. An anode electrode 14 is formed over the p-InP clad layer 13. Moreover, a cathode electrode 15 is formed over a back surface of the semiconductor substrate 11. The reflective semiconductor optical amplifier according to the embodiment includes a first region A1 at an input/output side of signal lights and a second region A2 at a side opposite to the input/output side of signal lights. A chirped grating 16 is formed over the second region A2. Moreover, a first antireflection film 17 is formed over an end face that is an input/output face of signal lights. A second antireflection film 18 is formed over an end face of a side where the chirped grating 16 is formed.

In order to reduce, if not prevent, weak light reflection at an end face, the SOA active layer 12 that becomes an SOA waveguide is formed in a vicinity of the end face where the first antireflection film 17 that becomes the optical signal input/output face is formed at an angle of approximately 5 to 10 degrees with respect to a direction substantially vertical to the end face. The input signal light 21 is incident on the SOA active layer 12 that is a waveguide through the first antireflection film 17 and the output signal light 22 is emitted from the SOA active layer 12 that is a waveguide through the first antireflection film 17.

For example, the reflective semiconductor optical amplifier according to the embodiment is formed with a length of about 1,100 μm from the first antireflection film 17 to the second antireflection film 18. For example, the first region A1 is formed with a length of about 700 μm, and the second region A2 is formed with a length of about 400 μm.

A design value of a coupling coefficient κ of the chirped grating 16 formed in the second region A2 is, for example, about 100 cm$^{-1}$. The period Λ is formed so that the period is consecutively changed from about 240 nm to 245 nm from a side that is an input/output end face side where the first antireflection film 17 is formed toward the reflection end face side where the second antireflection film 18 is formed. Central wavelength of reflection (Bragg wavelength) $\lambda_B$ in the chirped grating 16 is obtained by the following expression (2) using an equivalent refractive index in the SOA waveguide:

$$\lambda_B = 2 \times n \times \Lambda \qquad (2)$$

For example, an equivalent refractive index n of the SOA waveguide of the reflective semiconductor optical amplifier according to the embodiment is about 3.2. Thus, the chirped grating 16 is formed so that the Bragg wavelength $\lambda_B$ is consecutively changed from about 1,536 nm to 1568 nm from the input/output end face side toward the reflection end face side. As illustrated in the gain spectrum S1 in FIG. 5, in the wavelength band used in the WDM-PON, the gain spectrum in the SOA active layer 12 tends to become high in a shorter wavelength region and become low in a longer wavelength region when the chirped grating is not provided. However, the reflective semiconductor optical amplifier according to the embodiment, a signal light of short wavelength with a high internal gain coefficient is reflected in the vicinity of the input/output end in the chirped grating 16, and a signal light of a longer wavelength with a lower internal gain coefficient is reflected in the vicinity of the reflection end face in the chirped grating 16. Accordingly, a distance in which the signal light of shorter wavelength with a higher internal gain coefficient propagates in the SOA active layer 12 may be reduced; thereby the optical gain may be decreased. On the other hand, a distance in which the signal light of the longer wavelength with the lower internal gain coefficient propagates in the SOA active layer 12 may be increased; thereby the optical gain may be increased. Consequently, as illustrated in the gain spectrum S2, substantially uniform gain spectrum may be obtained in the wavelength band used in the WDM-PON.

In the reflective semiconductor optical amplifier according to the embodiment, the first antireflection film 17 is formed at the input/output end face and the SOA active layer 12 that becomes an SOA waveguide is formed at an angle of approximately 5 to 10 degrees with respect to a direction substantially vertical to the end face. Therefore, reflection of a signal light at the input/output end face may be decreased; thereby laser oscillation due to cavity resonance may be suppressed. Further, the coupling coefficient and the length of the chirped grating 16 may be adjusted so that laser oscillation due to distributed feedback (DFB) laser mode may not be caused by gain generated in the SOA active layer 12.

[Manufacturing Method of Reflective Semiconductor Optical Amplifier]

A manufacturing method of a reflective semiconductor optical amplifier according to the embodiment will be described by referring to FIGS. 8 and 9. FIGS. 8A to 8E are manufacturing process charts that illustrate a section along a long dashed short dashed line of 8A to 8B in FIG. 6. FIG. 9 is a sectional view illustrating a section along a long dashed short dashed line of 9A to 9B in FIG. 8A and the section is substantially the same as the section illustrated in FIG. 6.

Figure 8A:
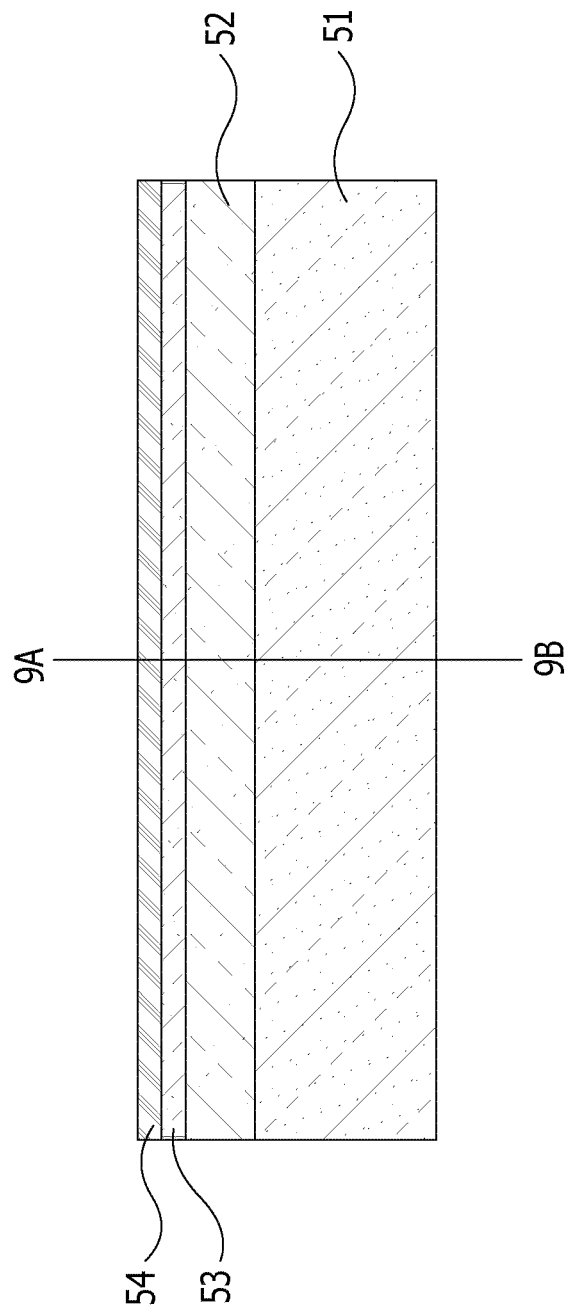
Figure 9:
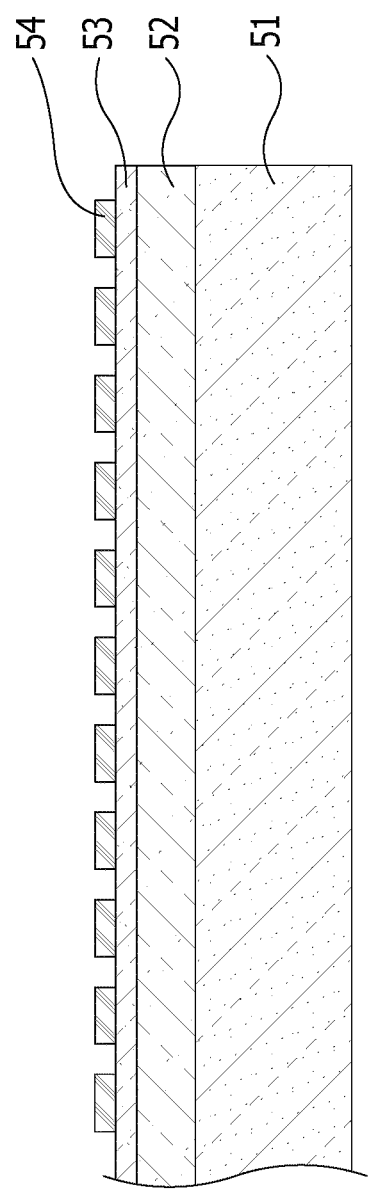
FIG. 9 is a sectional view along a line of 9A to 9B illustrated in FIG. 8A.

As illustrated in FIG. 8A, an n-InP clad layer 52 with a thickness of, for example, about 500 nm, and an i-InGaAsP film 53 with a thickness of, for example, about 60 nm, are laminated over an n-InP substrate 51 by a Metal-Organic Vapor Phase Epitaxy (MOVPE) method. A constituent wavelength of the formed i-InGaAsP film 53 is, for example, about 1.1 μm. The n-InP substrate 51 corresponds to the semiconductor substrate 11 illustrated in FIG. 4.

A resist pattern 54, which becomes a diffraction grating pattern in a region where a chirped grating is formed, is formed by applying a photoresist over the i-InGaAsP film 53, applying a pre-bake, and performing an exposure and development by electron beam (EB: drawing device). FIG. 9 illustrates the resist pattern 54 formed by the above-described method. As described above, the resist pattern 54 is formed so that, for example, the period Λ is consecutively changed from 240 nm to 245 nm.

Figure 8B:
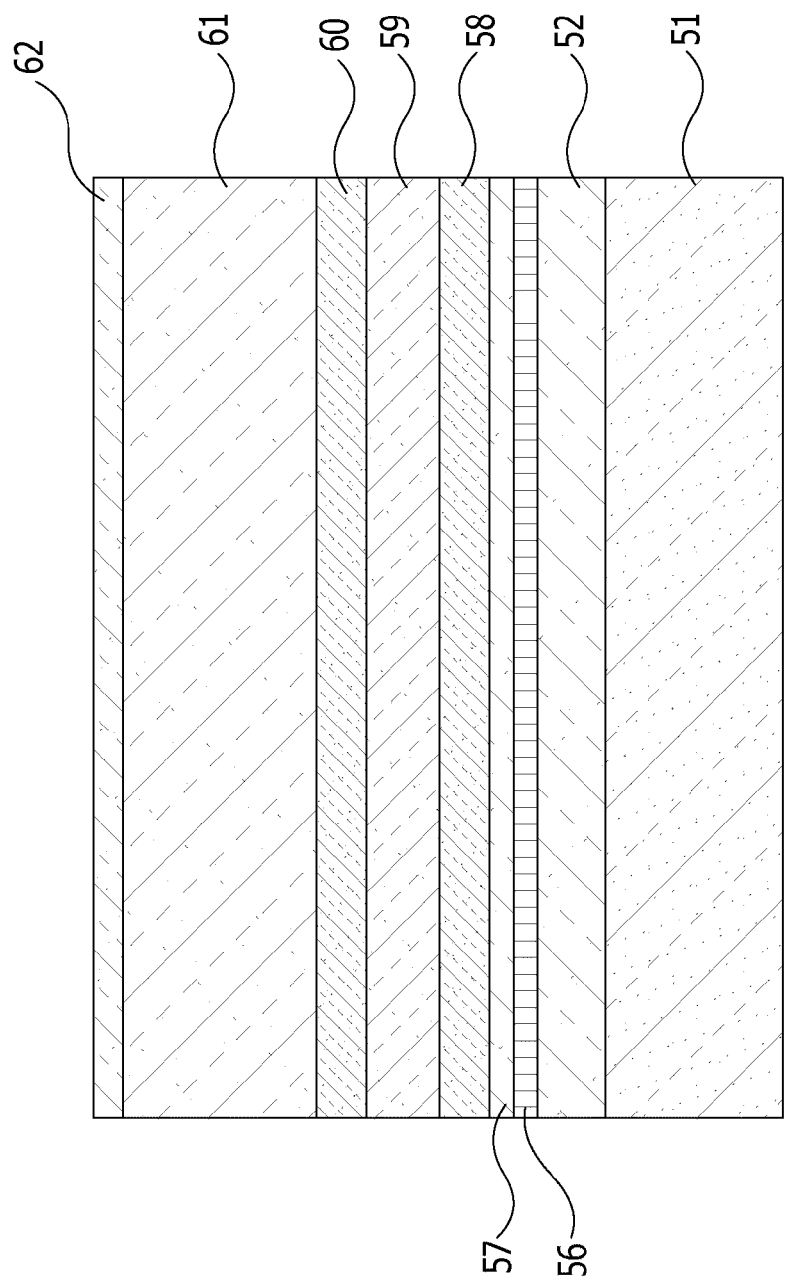

As illustrated in FIG. 8B, the i-InGaAsP film 53 in a region where the resist pattern 54 is not formed, the i-InGaAsP film 53 is removed, for example, by the Reactive Ion Etching (RIE) using the formed resist pattern 54 as a mask. The resist pattern 54 is removed and an InGaAsP diffraction grating layer 56 is formed. The InGaAsP diffraction grating layer 56 forms the chirped grating. An n-InP spacer layer 57, an InGaAsP optical confinement layer 58, a tensile strain InGaAs active layer 59, an InGaAsP optical confinement layer 60, a p-InP clad layer 61 and an InGaAsP contact layer 62 are laminated, for example, by a metal organic vapor phase epitaxial method (MOVPE). The thickness of the formed n-InP spacer layer 57 is, for example, about 100 nm, constituent wavelengths of the InGaAsP optical confinement layers 58 and 60 are, for example, about 1.3 μm with a thickness of about 100 nm and the thickness of the tensile strain InGaAs active layer 59 is, for example, about 70 nm. The thickness of the p-InP clad layer 61 is, for example, about 2 μm. The constituent wavelength of the InGaAsP contact layer 62 is, for example, about 1.3 μm with a thickness of, for example, about 500 nm. The tensile strain InGaAs active layer 59 corresponds to the SOA active layer 12 illustrated in FIG. 4 and the p-InP clad layer 61 corresponds to the clad layer 13 illustrated in FIG. 4.

Figure 8C:
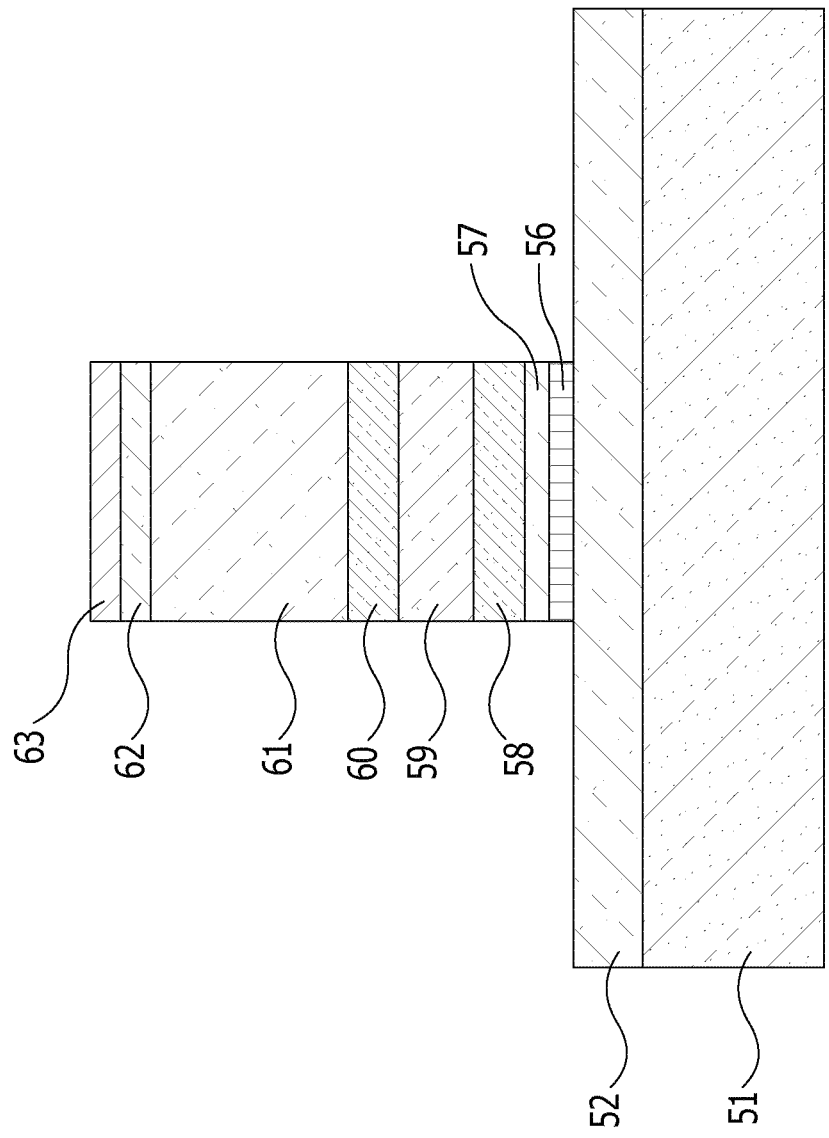

As illustrated in FIG. 8C, for example, an SiO$_2$ mask 63 is formed over the InGaAsP contact layer 62, and an etching is applied, for example, by a reactive ion etching (RIE), using the SiO$_2$ mask 63 as a mask. For example, the SiO$_2$ mask 63 is formed by forming a SiO$_2$ film, by applying a photo resist over the SiO$_2$ film, by applying a pre-bake, and by performing exposure and development with an exposure device. A mesa structure with a height of about 3 μm is formed by applying an etching, for example, by inductively coupled plasma (ICP)-RIE using the SiO$_2$ mask 63 as a mask.

As illustrated in FIG. 8D, for example, a Semi-Insulating (SI)-InP block layers 64 and 65 are formed over a side of the formed mesa structure by the MOVPE method. Consequently, a current constricting structure that efficiently supplies a current to the mesa structure region is formed. The SiO$_2$ mask 63 is removed.

As illustrated in FIG. 8E, an anode electrode 66 is formed over a side where the InGaAsP contact layer 62 is formed and a cathode electrode 67 is formed over a back surface of the semiconductor substrate 51. The anode electrode 66 corresponds to the anode electrode 14 in FIG. 4. The cathode electrode 67 corresponds to the cathode electrode 15 illustrated in FIG. 4. An end face is formed by cleavage, and the first antireflection film 17 illustrated in FIG. 6 is formed over the input/output end face and the second antireflection film 18 illustrated in FIG. 6 is formed over a reflection end face.

[Characteristics of Reflective Semiconductor Optical Amplifier]

Figure 10A:
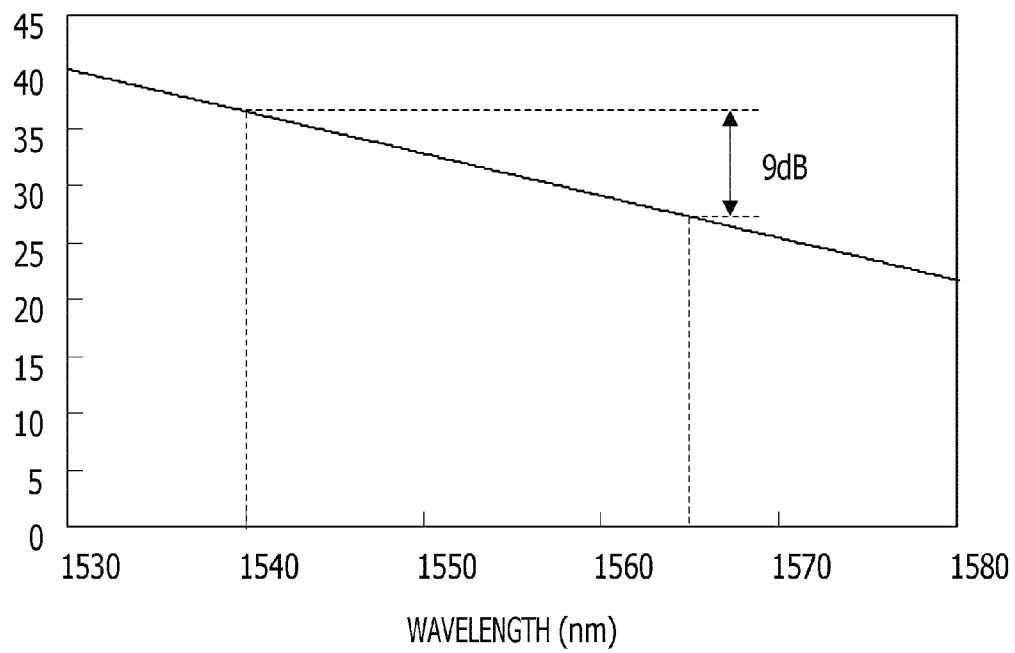
FIGS. 10A and 10B illustrate an optical gain spectrum of a reflective semiconductor optical amplifier.
Figure 10B:
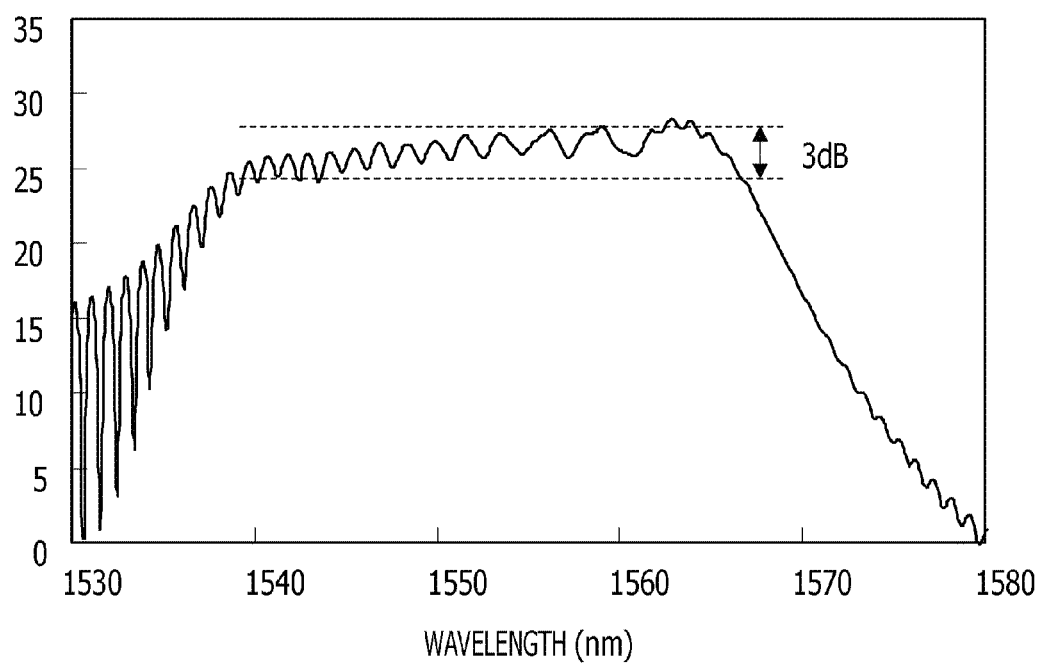

FIG. 10A is a gain spectrum in a reflective semiconductor optical amplifier with a structure illustrated in FIG. 2. An optical gain of the reflective semiconductor optical amplifier illustrated in FIG. 2 largely depends on wavelength and tends to decrease as a wavelength becomes longer. For example, an optical gain is about 34 dB when the wavelength is about 1,540 nm, while an optical gain is about 25 dB when the wavelength is about 1,565 nm, and the optical gain is reduced by about 9 dB. FIG. 10B illustrates a gain spectrum in the reflective semiconductor optical amplifier according to the embodiment. In the reflective semiconductor optical amplifier according to the embodiment, an optical gain within a range of about 1,540 to 1,565 nm is about 24 dB or more, and a variation range of optical gains is about 3 dB at substantially the maximum. The reflective semiconductor optical amplifier according to the embodiment may achieve substantially uniform optical gain in a wide wavelength band.

According to the embodiment, the case is described in which the period Λ is changed in the chirped grating 16; however, a refractive index may be changed.

According to the embodiment, the period Λ is continuously increased from 240 to 245 nm towards the reflection end face with an antireflection film 18 to cancel out the wavelength dependence of the internal gain coefficient of the SOA active layer 12 that is larger for the shorter wavelength, however, the chirping of the period Λ may be changed and designed with a large flexibility corresponding to the other wavelength dependence of the internal gain coefficient of the SOA active layer 12.

[Second Embodiment]

Figure 12:
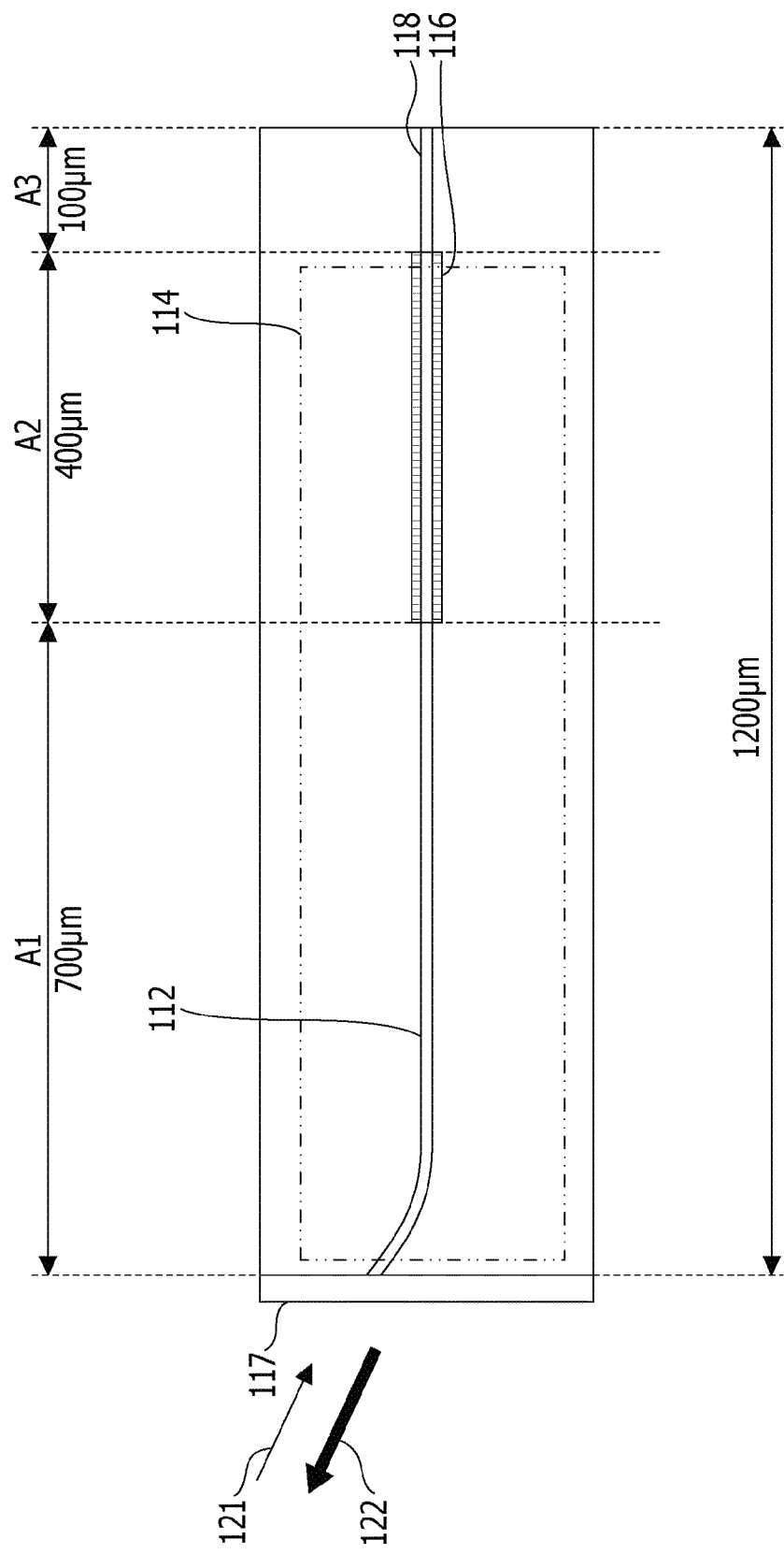
FIG. 12 is a top perspective view of the reflective semiconductor optical amplifier according to the second embodiment.

A second embodiment will be described by referring to FIGS. 11 and 12. FIG. 11 is a structural diagram of a section along a lamination direction of the reflective semiconductor optical amplifier according to the second embodiment. FIG. 12 is a top perspective view of the reflective semiconductor optical amplifier according to the second embodiment.

In the reflective semiconductor optical amplifier according to the embodiment, a first optical confinement layer 131, an SOA active layer 112, a second optical confinement layer 132, and a p-InP clad layer 113 are laminated over an n-InP semiconductor substrate 111. An anode electrode 114 is formed over the p-InP clad layer 113. A cathode electrode 115 is formed over a back surface of the semiconductor substrate 111. In the reflective semiconductor optical amplifier, a first region A1, a second region A2, and a third region A3 are formed in order from the input/output side of the signal lights. In other words, the third region A3 contacts to the second region and is formed over a side of the second region A2 opposite to a side that contacts to the first region. The chirped grating 116 is formed in the second region A2 and an antireflection film 117 is formed over an end face of the first region A1 side that is an input/output face of signal lights. In the third region A3, the anode electrode 114 and the cathode electrode 115 are not formed, thus, the SOA active layer 112 becomes a light absorption layer 118. For example, the light absorption layer 118 in the third region A3 absorbs light generated in the SOA active layer 112 and a part of signal light which is not reflected in the chirped grating 116 in the second region A2 because no electric current is injected through the anode electrode 114. In other words, a region into which no current is injected in the SOA active layer may achieve very high absorption coefficient for a signal light, etc. Thus, the SOA active layer formed in the third region becomes the light absorption layer 118 and absorbs a signal light, etc.

In order to reduce, if not prevent, weak light reflection at an end face, the SOA active layer 112 that becomes an SOA waveguide is formed in a vicinity of the end face where the antireflection film 117 that becomes the optical signal input/output face is formed at an angle of approximately 5 to 10 degrees with respect to a direction substantially vertical to the end face. The input signal light 121 is incident on the SOA active layer 112 that is a waveguide through the antireflection film 117 and the output signal 122 is emitted from the SOA active layer 112 that is a waveguide through the antireflection film 117.

The reflective semiconductor optical amplifier according to the embodiment is formed with a total length of, for example, about 1,200 μm. The first region A1 is, for example, about 700 μm, the second region A2 is, for example, about 400 μm, and the third region A3, for example, is about 100 μm.

A design value of a coupling coefficient κ of the chirped grating 16 formed in the second region A2 is, for example, about 100 cm$^{-1}$. The period Λ is formed so that the period is consecutively changed from about 240 nm to 245 nm from a side where the antireflection film 117 is formed that is an input/output end face side toward a side that becomes a light absorption layer 118 that is the reflection end face.

For example, the equivalent refractive index n of the SOA active layer 112 of the reflective semiconductor optical amplifier according to the embodiment is about 3.2. Thus, for example, the chirped grating 116 is formed so that the Bragg wavelength is consecutively changed from about 1,536 nm to 1568 nm from the input/output end face side toward the reflection end face. Accordingly, a signal light of shorter wavelength with an higher internal gain coefficient may be reflected in the vicinity of the input/output end face side in the chirped grating 116, and a signal light of long wavelength with a lower internal gain coefficient may be reflected in the vicinity of the reflection end face in the chirped grating 116. Thus, a distance in which the signal light of short wavelength with the high internal gain coefficient propagates in the SOA active layer 112 may be reduced; thereby the optical gain may be reduced. On the other hand, a distance in which the signal light of long wavelength with the low internal gain coefficient propagates in the SOA active layer 112 may be increased; thereby the optical gain may be increased. Consequently, a substantially uniform gain spectrum may be obtained in the wavelength band used in the WDM-PON.

According to the embodiment, the light that is not reflected by the chirped grating 116 may be absorbed by forming the light absorption layer 118 over the reflection end side even when an antireflection film is not formed over the reflection end face side. Moreover, the light absorption layer 118 is formed very easily because an anode electrode 114 and a cathode electrode 115 are not formed in the third region A3. According to the embodiment, the case is described in which neither the anode electrode 114 nor the cathode electrode 115 is formed in the third region A3, in other words, both the anode electrode 114 and the cathode electrode 115 are typically formed in the first region A1 and the second region A2. Substantially the same advantage may be achieved by a structure in which the anode electrode 114 to which a current is injected is not formed in the third region A3, in other words, a structure in which the anode electrode 114 is typically formed only in the first region A1 and the second region A2.

The contents other than described the above are substantially the same as the contents of the first embodiment.

[Third Embodiment]

Figure 13:
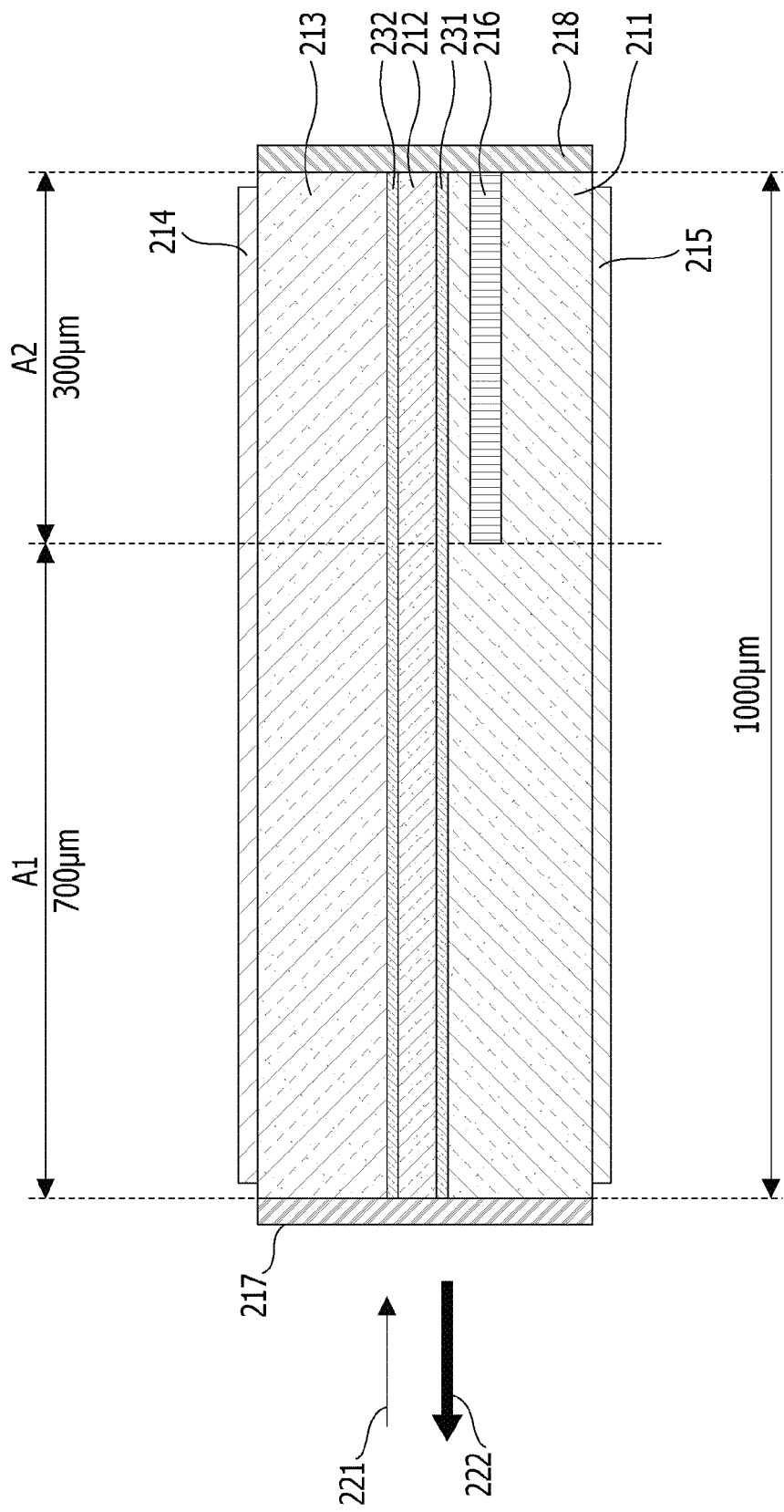
FIG. 13 is a structural diagram of the reflective semiconductor optical amplifier according to a third embodiment.
Figure 14:
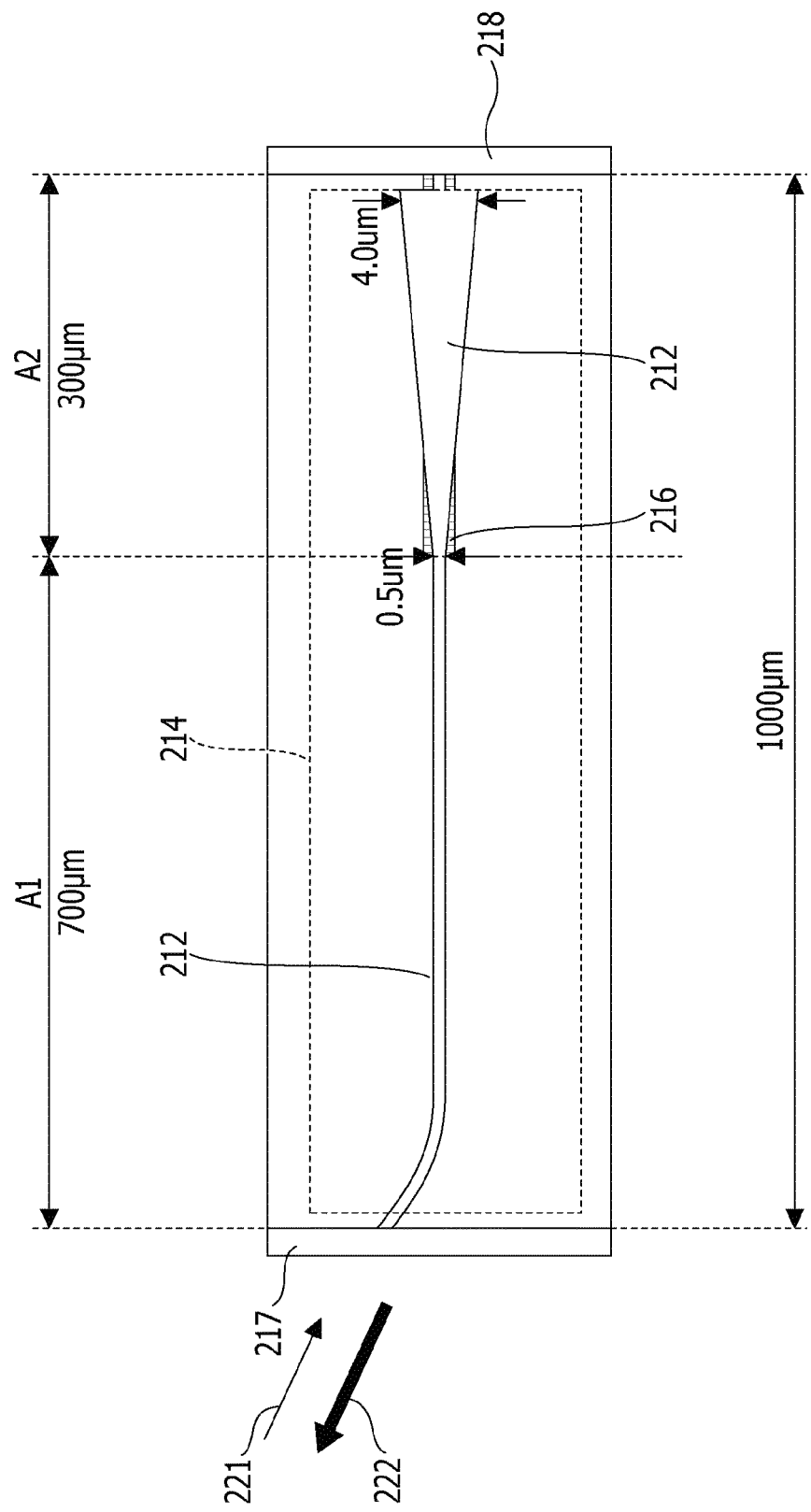
FIG. 14 is a top perspective view of the reflective semiconductor optical amplifier according to the third embodiment.

A third embodiment will be described by referring to FIGS. 13 and 14. FIG. 13 is a structural diagram of a section of a lamination direction of the reflective semiconductor optical amplifier according to the third embodiment. FIG. 14 is a top perspective view of the reflective semiconductor optical amplifier according to the third embodiment.

In the reflective semiconductor optical amplifier according to the embodiment, a first optical confinement layer 231, an SOA active layer 212, a second optical confinement layer 232, and a p-InP clad layer 213 are laminated over an n-InP semiconductor substrate 211. An anode electrode 214 is formed over the p-InP clad layer 213. Moreover, a cathode electrode 215 is formed over a back surface of the semiconductor substrate 211. The reflective semiconductor optical amplifier according to the embodiment includes a first region A1 at an input/output side of signal lights and a second region A2 at a side opposite to the input/output side of signal lights. A chirped grating 216 is formed in the second region A2. Moreover, a first antireflection film 217 is formed over an end face that becomes an input/output face of signal lights. A second antireflection film 218 is formed over an end face of a side where the chirped grating 216 is formed.

The SOA active layer 212 that becomes an SOA waveguide is formed in a vicinity of an end face where the antireflection film 217 that becomes the optical signal input/output face is formed at an angle of, for example, approximately 5 to 10 degrees with respect to a direction substantially vertical to the end face. The input signal light 221 is incident on the SOA active layer 212 that is a waveguide through the first antireflection film 217 and the output signal 222 is emitted from the SOA active layer 212 that is a waveguide through the first antireflection film 217.

The reflective semiconductor optical amplifier according to the embodiment is formed with a total length of, for example, about 1,000 μm. The first region A1 is for example, about 700 μm, the second region A2 is, for example, about 300 μm.

In the reflective semiconductor optical amplifier according to the embodiment, a period Λ of the chirped grating 216 is, for example, about 240 nm and substantially constant, and a width of the SOA active layer 212 is tapered so as to become wider as the SOA active layer 212 becomes closer to the reflection end face side in the second region A2. For example, a width of the SOA active layer 12 that becomes an optical waveguide is, for example, about 0.5 μm at a border between the first region A1 and the second region A2 and tapered linearly to, for example, about 4.0 μm in the vicinity of the reflection end surface. The structure is called a width tapered waveguide structure. The structure allows change of an apparent equivalent refractive index nt of the SOA active layer 212 of the second region, for example, from 3.20 to 3.25 by changing the width of the SOA active layer 212. Accordingly, central wavelength of reflection (Bragg wavelength) $\lambda_B$ in the chirped grating 216 is consecutively changed from the input/output end face side to the reflection end face, for example, from about 1,536 nm to 1,568 nm.

In the reflective semiconductor optical amplifier according to the embodiment, a signal light of short wavelength with a higher internal gain coefficient is made to reflect at the input/output end face side in the chirped grating 216, thereby a distance that the signal light of short wavelength propagates in the SOA active layer 212 is decreased and the optical gain may be decreased. A signal light of long wavelength with a lower internal gain coefficient is made to reflect at the reflection end face side in the chirped grating 216, thereby a distance that the signal light of long wavelength propagates in the SOA active layer 212 is increased and the optical gain may be increased. Accordingly, a substantially uniform gain spectrum in the wavelength band used in the WDM-PON may be obtained.

The SOA active layer 212 according to the embodiment may be formed with substantially the same method as that of the first embodiment by using an SiO2 mask that changes a width of a mesa structure in the second region A2.

According to the embodiment, the case is described in which an equivalent refractive index nt is changed with a width tapered structure that changes a width of the SOA active layer 212. The same advantage may be achieved by applying a tapered thickness structure that changes the SOA active layer 212, etc., with respect to a film thickness direction.

The contents other than described the above is substantially the same as the contents of the first embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments in accordance with aspects of the present inventions have been described in detail, it should be understood that the various changes, substitutions, and alterations could be made hereto without departing from the spirit and scope of the invention.

What is claimed is:

1. A reflective semiconductor optical amplifier comprising:
a semiconductor substrate;
an active layer that includes a first region and a second region formed over the semiconductor substrate; and
a reflection part that is formed along the second region and includes a first portion that reflects a first wavelength light having a first gain coefficient and a second portion that reflects a second wavelength light having a second gain coefficient which is smaller than the first gain coefficient,
wherein the first portion is formed closer to the first region side than the second portion, and
wherein the active layer includes a first end face of the first region from which the first wavelength light and the second wavelength light are input and from which a reflected first wavelength light reflected by the first portion and a reflected second wavelength light reflected the second portion are output from the second region via the first region and positions of the first portion and the second portion are set so that a first product of a first effective length of the reflective semiconductor optical amplifier for the first wavelength light and the first gain coefficient and a second product of a second effective length of the reflective semiconductor optical amplifier for the second wavelength light and the second gain coefficient become substantially constant.

2. The reflective semiconductor optical amplifier according to claim 1, further comprising:
a first optical confinement layer formed between the semiconductor substrate and the active layer;
a second optical confinement layer formed over the active layer;
a clad layer formed over the second optical confinement layer;
an anode electrode formed over the clad layer; and
a cathode electrode formed at a back surface of the semiconductor substrate.

3. The reflective semiconductor optical amplifier according to claim 2, wherein
a voltage is applied between the anode electrode and the cathode electrode.

4. The reflective semiconductor optical amplifier according to claim 1, wherein
the active layer includes GaInAs.

5. The reflective semiconductor optical amplifier according to claim 1, wherein
the substrate includes InP.

6. The reflective semiconductor optical amplifier according to claim 2, wherein
the first optical confinement layer, the active layer, the second optical confinement layer, and the clad layer are formed by a metal organic vapor phase epitaxial method.

7. The reflective semiconductor optical amplifier according to claim 2, further comprising:
a contact layer formed between the clad layer and the anode electrode.

8. The reflective semiconductor optical amplifier according to claim 1, wherein
a position of the reflection part changes in response to a wavelength of light that is incident from the first end face of the active layer.

9. The reflective semiconductor optical amplifier according to claim 8, wherein
the light that is incident has a wavelength in a wavelength band used in multiple-wavelength communication.

10. The reflective semiconductor optical amplifier according to claim 8, wherein
the wavelength of the light that is incident on is from about 1,540 nm to about 1,565 nm.

11. The reflective semiconductor optical amplifier according to claim 1, wherein
the reflection part is a chirped grating.

12. The reflective semiconductor optical amplifier according to claim 11, wherein,
a period of diffraction gratings of the chirped grating is changed from one end to the other end along the active layer.

13. The semiconductor optical amplifier according to claim 1, wherein
the reflection part is a substantial uniform diffraction grating, and
a width of the active layer in the second region is consecutively changed from a border between the first region and the second region toward an end face of the second region.

14. The reflective semiconductor optical amplifier according to claim 11, wherein
the chirped grating includes an InGaAsP.

15. The reflective semiconductor optical amplifier according to claim 1, wherein
the active layer is formed in the first end face of the active layer in the first region with a tilted angle with respect to a direction substantially vertical to the first end face.

16. The reflective semiconductor optical amplifier according to claim 1, further comprising:
a first antireflection film formed over the end face of the active layer to and from which signal light is input and output in the first region.

17. The reflective semiconductor optical amplifier according to claim 1, further comprising:
a second antireflection film formed over a second end face of the active layer in the second region.

18. The reflective semiconductor optical amplifier according to claim 16, wherein the antireflection film is a multilayer dielectric film.

19. The semiconductor optical amplifier according to claim 1, further comprising:
- a third region formed over a side that contacts with the second region and opposite to a side that contacts with the first region in the second region; and
- an optical absorption layer that absorbs light formed in the third region.

20. The semiconductor optical amplifier according to claim 19, further comprising:
- an anode electrode formed typically in the first region and the second region.

* * * * *